(12) United States Patent
Kiehlbauch

(10) Patent No.: US 10,014,301 B2
(45) Date of Patent: Jul. 3, 2018

(54) SEMICONDUCTOR CONSTRUCTIONS

(71) Applicant: Micron Technology, Inc., Boise, ID (US)

(72) Inventor: Mark Kiehlbauch, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 355 days.

(21) Appl. No.: 14/848,115

(22) Filed: Sep. 8, 2015

(65) Prior Publication Data

US 2016/0005742 A1    Jan. 7, 2016

Related U.S. Application Data

(60) Continuation of application No. 13/485,884, filed on May 31, 2012, now Pat. No. 9,153,497, which is a division of application No. 12/720,136, filed on Mar. 9, 2010, now Pat. No. 8,207,041.

(51) Int. Cl.
| | |
|---|---|
| *H01L 27/108* | (2006.01) |
| *H01L 21/768* | (2006.01) |
| *H01L 21/8234* | (2006.01) |
| *H01L 29/78* | (2006.01) |
| *H01L 23/528* | (2006.01) |
| *H01L 23/535* | (2006.01) |

(52) U.S. Cl.
CPC .. *H01L 27/10808* (2013.01); *H01L 21/76897* (2013.01); *H01L 21/823425* (2013.01); *H01L 21/823475* (2013.01); *H01L 23/528* (2013.01); *H01L 23/535* (2013.01); *H01L 29/78* (2013.01); *H01L 2924/0002* (2013.01)

(58) Field of Classification Search
CPC ......... H01L 2924/0002; H01L 2924/00; H01L 21/76897; H01L 2924/00014; H01L 27/115
See application file for complete search history.

(56) References Cited

U.S. PATENT DOCUMENTS

| | | |
|---|---|---|
| 6,080,620 A | 6/2000 | Jeng |
| 6,229,169 B1 | 5/2001 | Hofmann et al. |
| 6,756,313 B2 | 6/2004 | Choi et al. |
| 6,960,506 B2 | 11/2005 | Chiu et al. |
| 7,382,054 B2 | 6/2008 | Luoh et al. |

(Continued)

FOREIGN PATENT DOCUMENTS

WO    WO 2008/110497    9/2008

*Primary Examiner* — Tony Tran
(74) *Attorney, Agent, or Firm* — Wells St. John P.S.

(57) ABSTRACT

Some embodiments include methods in which a pair of spaced-apart adjacent features is formed over a substrate. The features have silicon dioxide surfaces. Silicon nitride is deposited between the features. A first region of the silicon nitride is protected with a mask while a second region is not. The second region is removed to form an opening between the features. Some embodiments include semiconductor constructions that contain a pair of spaced-apart adjacent features. The features are lines extending along a first direction, and are spaced from one another by a trench. Alternating plugs and intervening materials are within the trench, with the plugs and intervening materials alternating along the first direction. The intervening materials consist of silicon nitride, and the plugs have lateral peripheries that directly contact silicon dioxide of the features, and that directly contact silicon nitride of the intervening regions.

20 Claims, 6 Drawing Sheets

(56) References Cited

U.S. PATENT DOCUMENTS

| | | |
|---|---|---|
| 7,420,240 B2 | 9/2008 | Rudeck |
| 2003/0082900 A1 | 5/2003 | Peng et al. |
| 2003/0113973 A1 | 6/2003 | Chu |
| 2004/0173912 A1 | 9/2004 | Rhodes |
| 2005/0098820 A1 | 5/2005 | Rudeck |

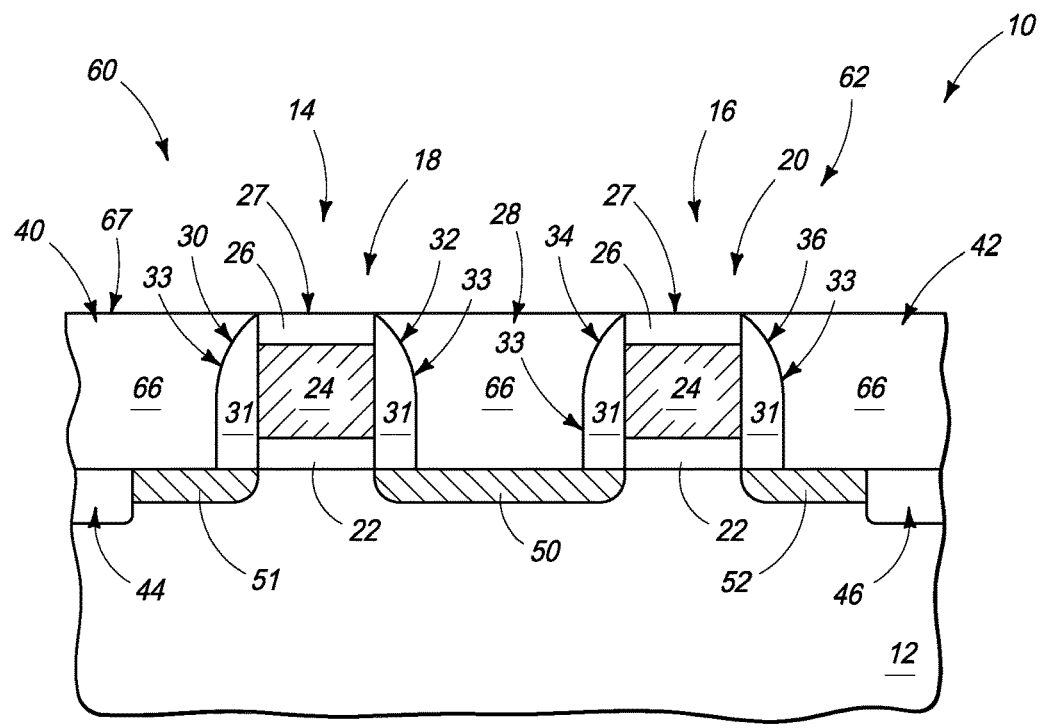
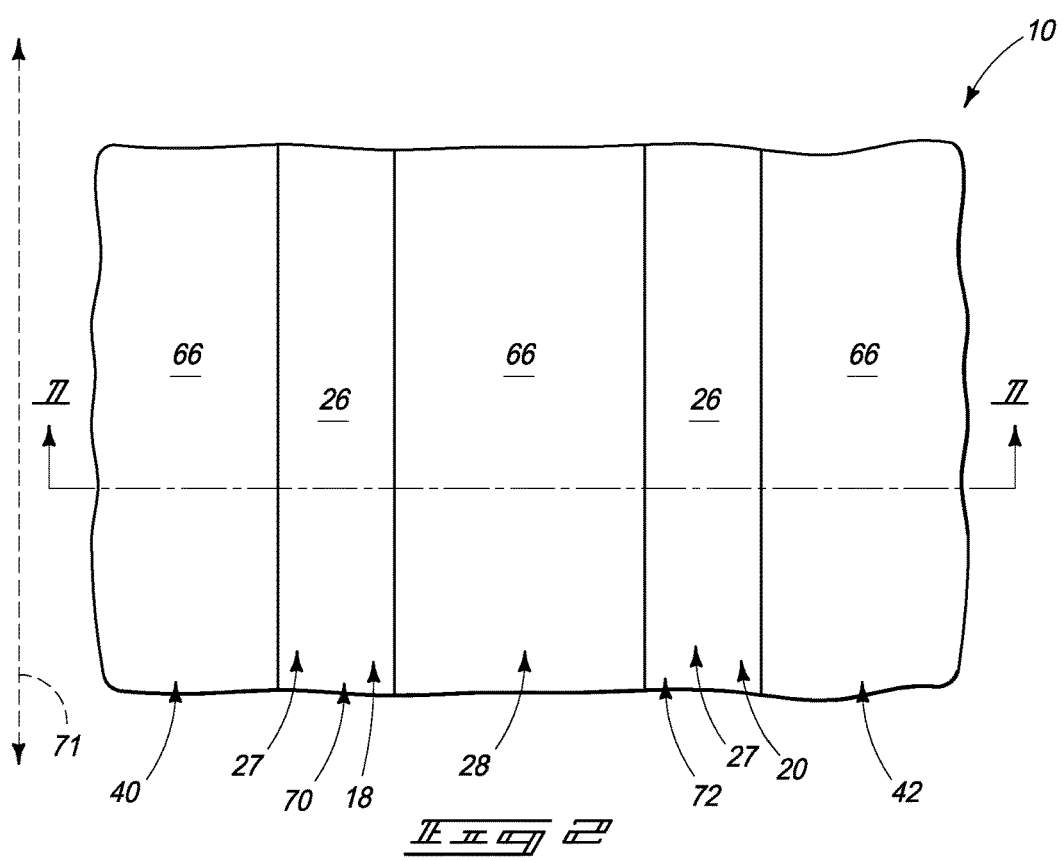

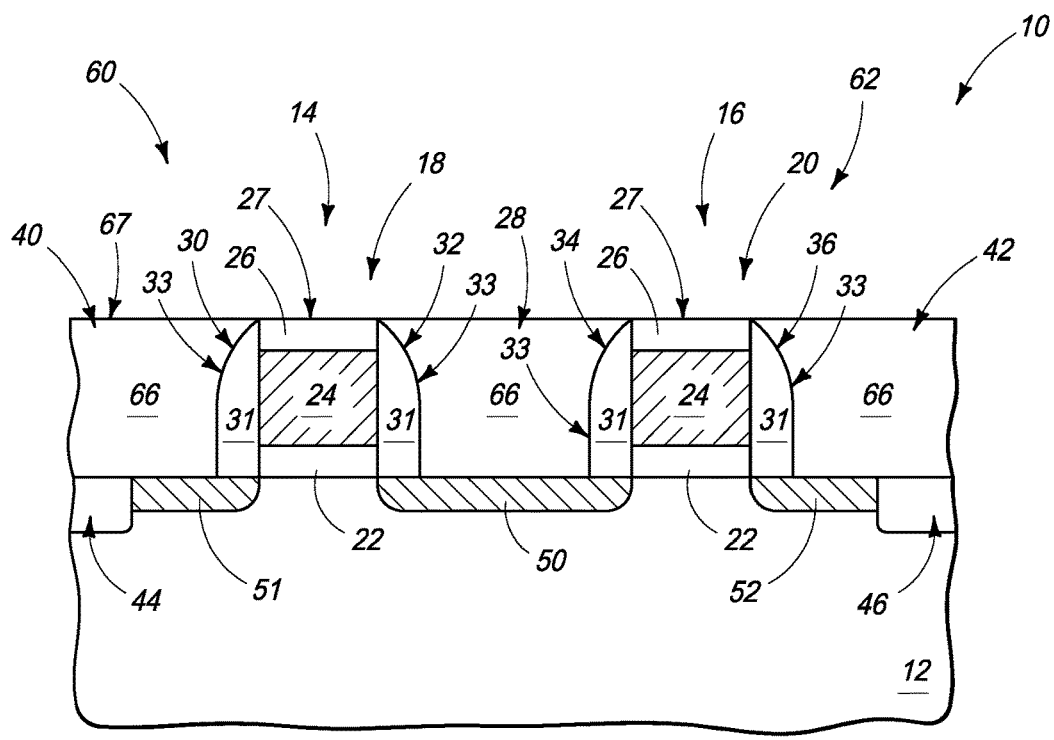
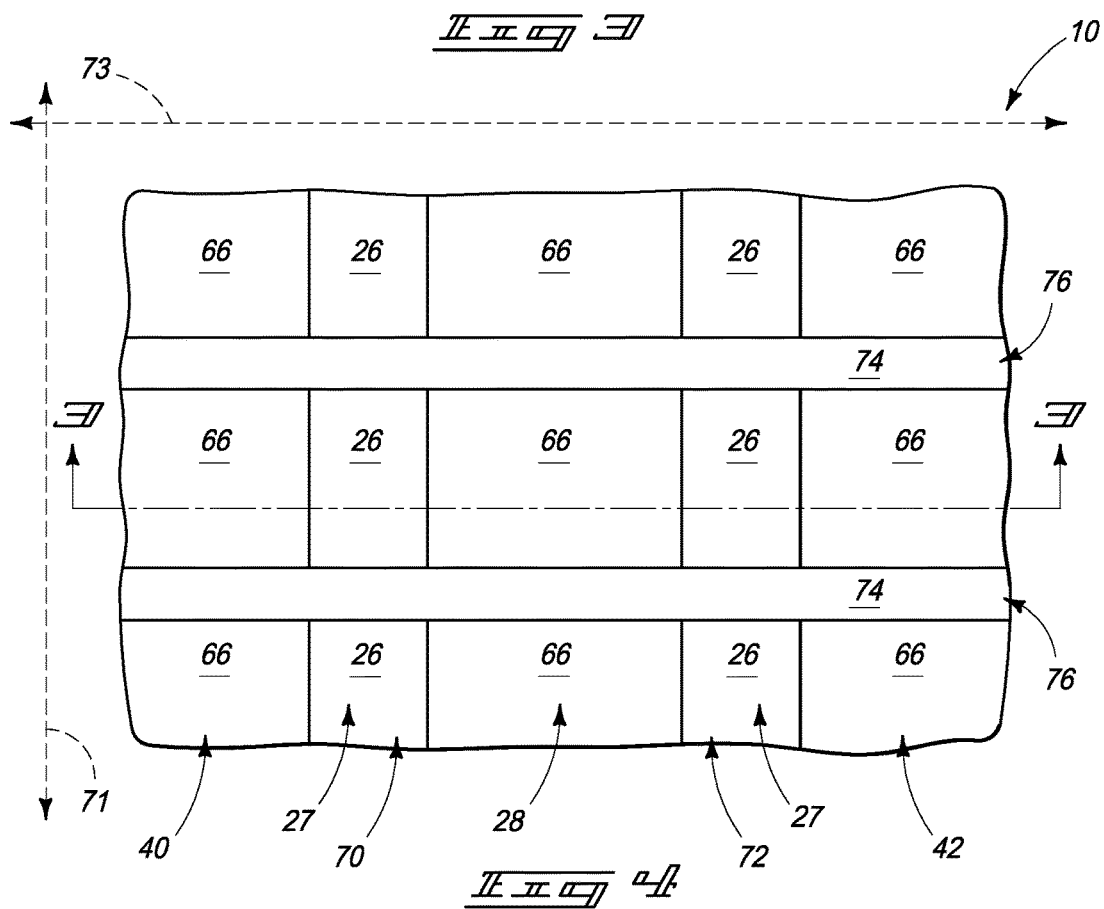

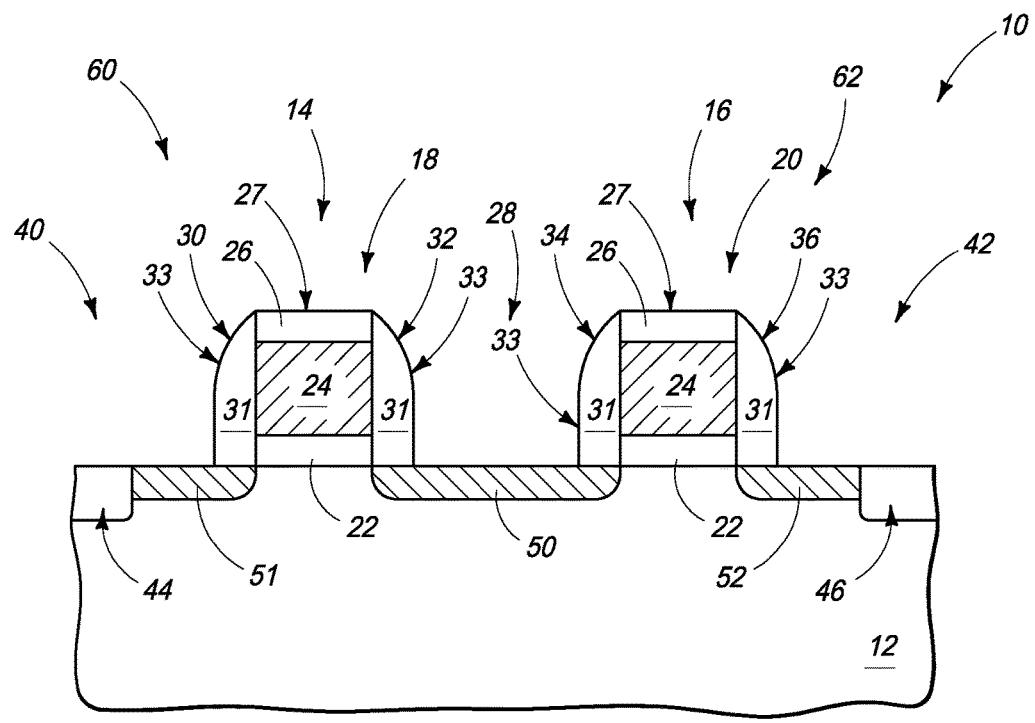
_FIG. 5_
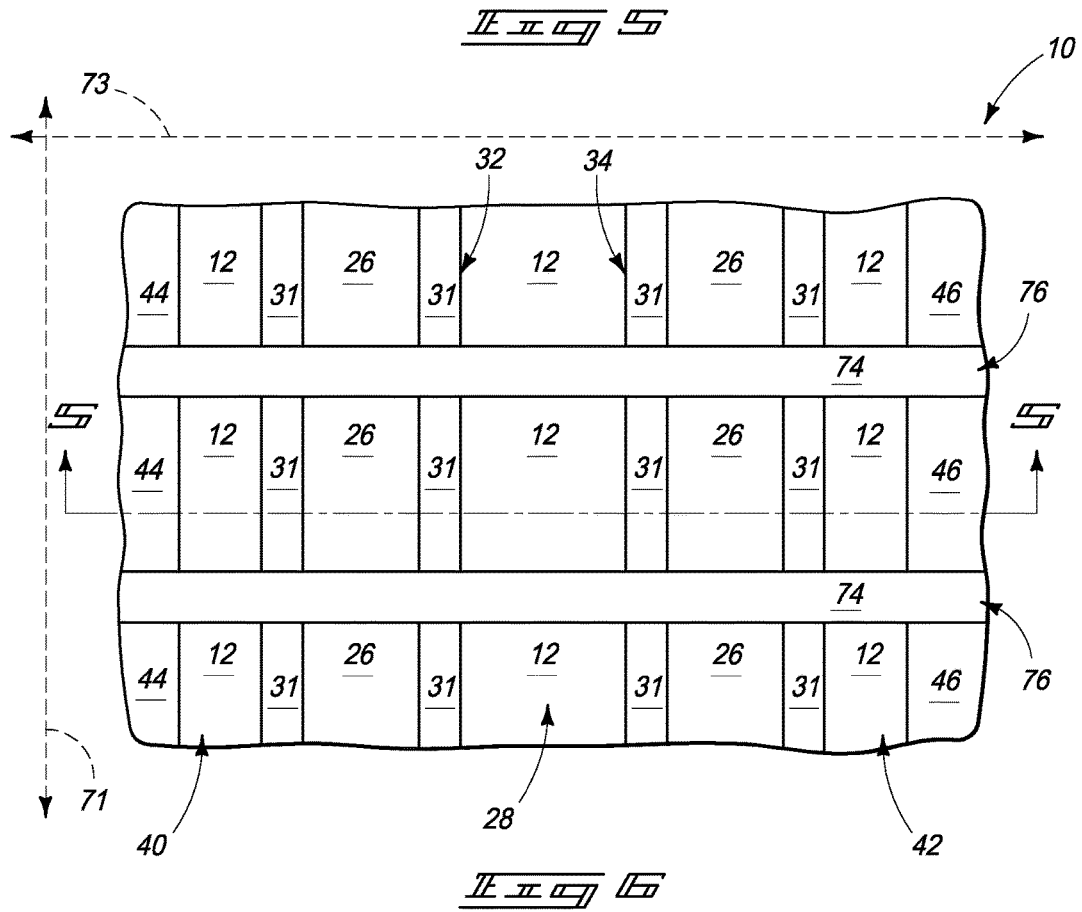
_FIG. 6_

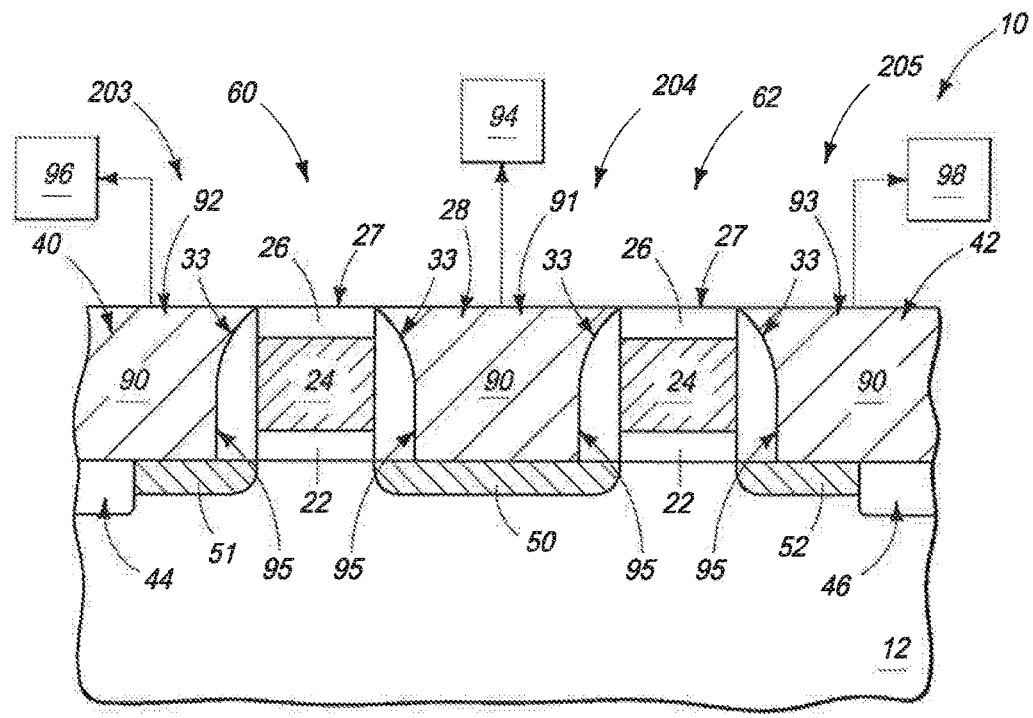
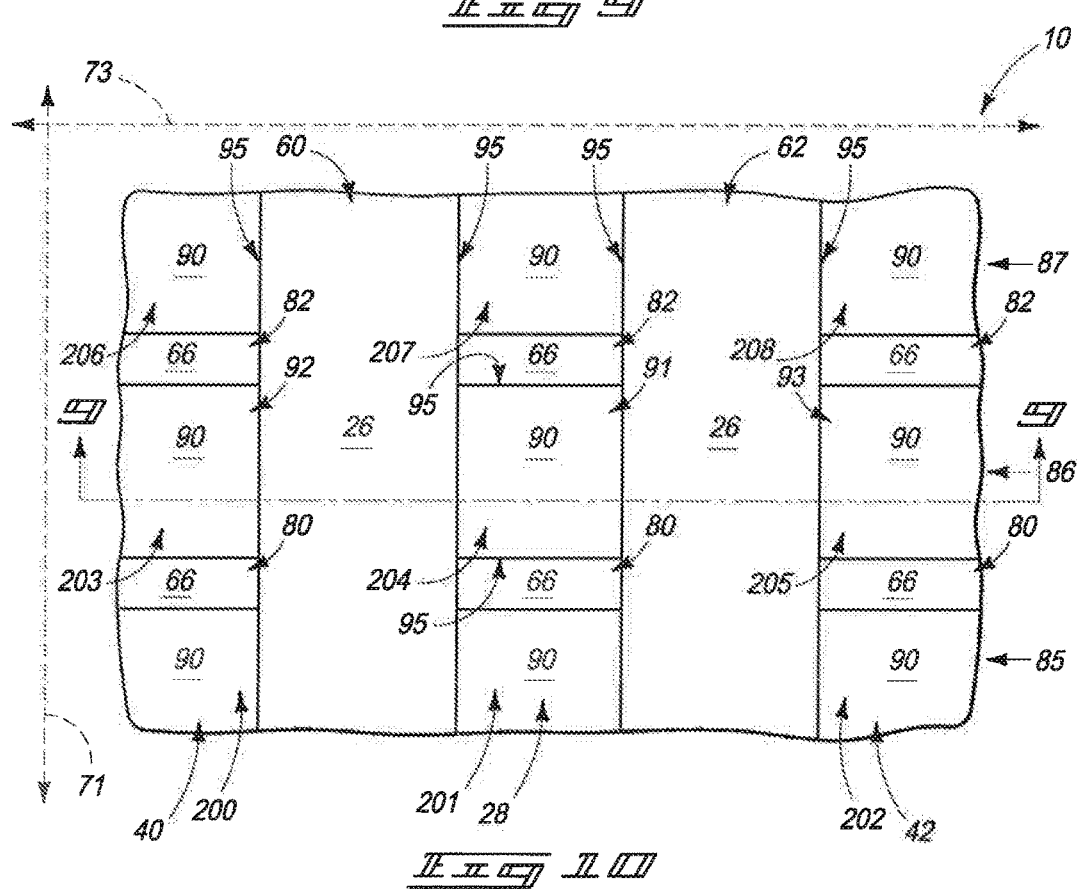

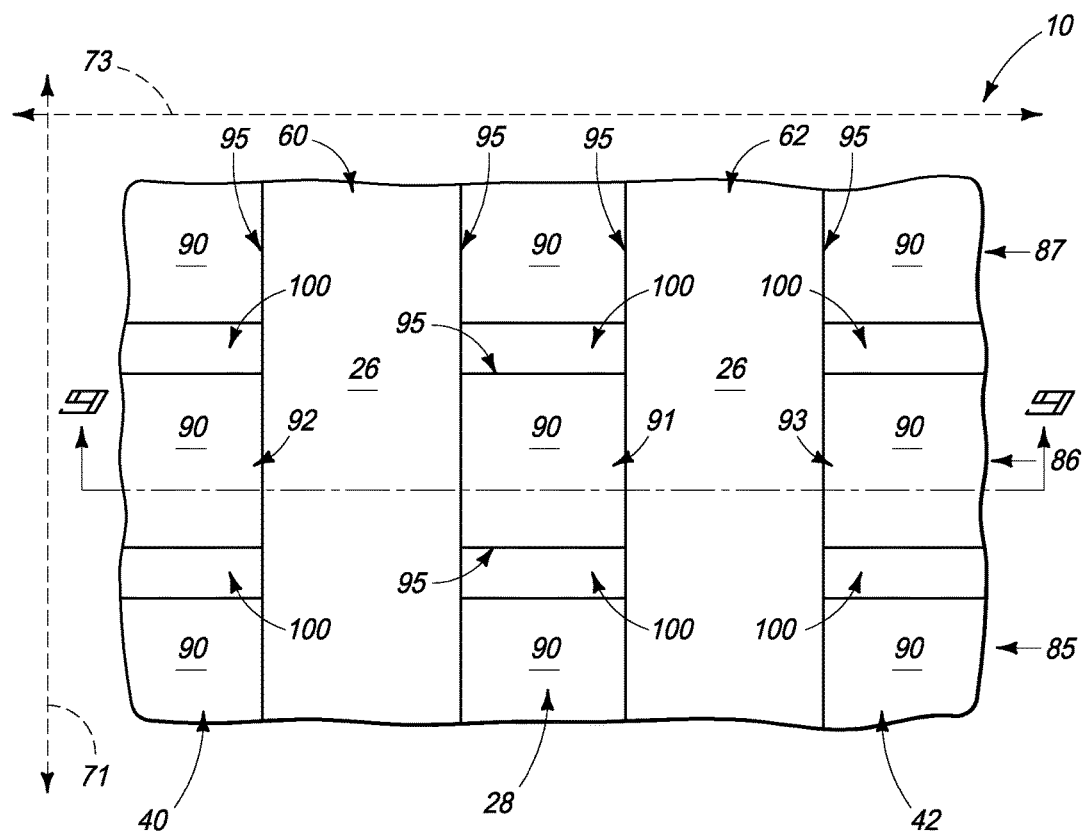

SEMICONDUCTOR CONSTRUCTIONS

RELATED PATENT DATA

This patent resulted from a continuation of U.S. patent application Ser. No. 13/485,884 which was filed May 31, 2012, which is a divisional of U.S. patent application Ser. No. 12/720,136, which was filed Mar. 9, 2010, now U.S. Pat. No. 8,207,041, each of which is hereby incorporated herein by reference.

TECHNICAL FIELD

Semiconductor constructions, and semiconductor processing methods.

BACKGROUND

Semiconductor processing methods are methods utilized in the fabrication of various structures associated with semiconductor substrates. For instance, semiconductor processing methods are utilized for the fabrication of integrated circuitry across semiconductor wafers.

Semiconductor processing often involves fabrication of multiple levels of integrated circuitry, with the various levels being stacked one over the other. Electrical contacts are formed to extend between the levels, and to thus interconnect the various levels with one another. Difficulties may occur in aligning the contacts to an underlying level.

One method that has been developed to address such difficulties is the utilization of so-called self-aligned contacts. A self-aligned contact may be formed by providing sacrificial material over a region where an electrical contact is ultimately to be made, and providing patterned material around the sacrificial material. Subsequently, the sacrificial material may be removed selectively relative to the patterned material to leave an opening aligned with the location where electrical contact is to be made.

It is common to utilize silicon dioxide as a sacrificial material, and to use silicon nitride for the patterned material to which the silicon dioxide is selectively removed. Part of the reason why such processing is common is that numerous etches are known which remove silicon dioxide with high selectively relative to silicon nitride. Unfortunately, such etches often utilize very high bias, and can damage silicon nitride structures. The etches can be particularly detrimental to corners of silicon nitride structures, and will generally round such corners. In some instances, the etches may even remove enough corner material to create facets at locations that had initially been corners. Overly aggressive etching may remove enough silicon nitride to expose underlying conductive materials, which can then lead to undesired electrical shorting between adjacent electrical components.

A continuing goal of semiconductor processing is to increase integration; and accordingly to decrease the size of individual components, and to decrease the spacings between individual components. Conventional methods of etching silicon dioxide sacrificial materials relative to silicon nitride are becoming increasingly difficult to scale to the smaller dimensions associated with increased integration.

It is desired to develop new semiconductor processing methods which reduce or avoid the above-discussed problems.

BRIEF DESCRIPTION OF THE DRAWINGS

FIGS. 1 and 2 are a diagrammatic cross-sectional side view, and a diagrammatic top view, respectively, of a semiconductor construction at a processing stage of an example embodiment. The cross-sectional view of FIG. 1 is along the line 1-1 of FIG. 2.

FIGS. 3 and 4 are a diagrammatic cross-sectional side view, and a diagrammatic top view, respectively, of the semiconductor construction of FIGS. 1 and 2 shown at a processing stage subsequent to that of FIGS. 1 and 2. The cross-sectional view of FIG. 3 is along the line 3-3 of FIG. 4.

FIGS. 5 and 6 are a diagrammatic cross-sectional side view, and a diagrammatic top view, respectively, of the semiconductor construction of FIGS. 1 and 2 shown at a processing stage subsequent to that of FIGS. 3 and 4. The cross-sectional view of FIG. 5 is along the line 5-5 of FIG. 6.

FIGS. 9 and 10 are a diagrammatic cross-sectional side view, and a diagrammatic top view, respectively, of the semiconductor construction of FIGS. 1 and 2 shown at a processing stage subsequent to that of FIGS. 7 and 8. The cross-sectional view of FIG. 9 is along the line 9-9 of FIG. 10.

FIG. 11 is a diagrammatic diagrammatic top view of the semiconductor construction of FIG. 2 shown at a processing stage subsequent to that of FIG. 10.

DETAILED DESCRIPTION OF THE ILLUSTRATED EMBODIMENTS

Figure 7:
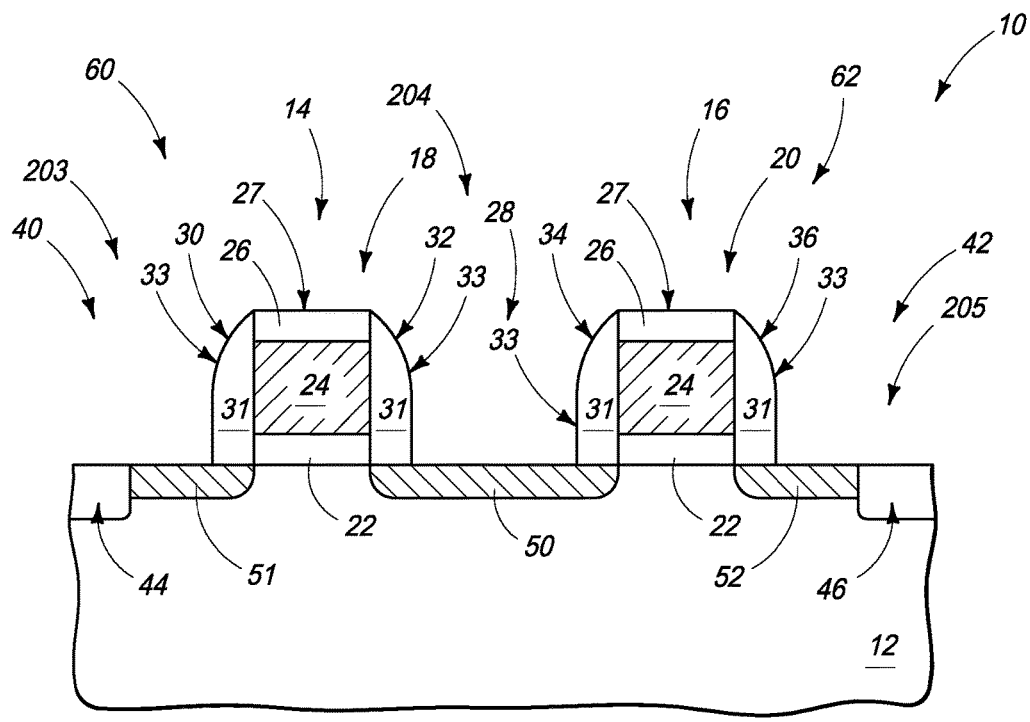
FIGS. 7 and 8 are a diagrammatic cross-sectional side view, and a diagrammatic top view, respectively, of the semiconductor construction of FIGS. 1 and 2 shown at a processing stage subsequent to that of FIGS. 5 and 6. The cross-sectional view of FIG. 7 is along the line 7-7 of FIG. 8.

Some embodiments are directed toward the utilization of silicon nitride-containing sacrificial materials and silicon dioxide-containing patterning materials. In other words, the embodiments flip the respective roles of the silicon dioxide-containing materials and silicon nitride-containing materials relative to the prior art processing described in the "Background" section of this disclosure. One of the reasons that the prior art does not utilize silicon nitride as a sacrificial material relative to silicon dioxide-containing patterning materials is that it may be more difficult to selectively remove silicon nitride relative to silicon dioxide, than vice versa. However, a consideration that led to some of the embodiments described herein is recognition that the bias utilized for removing silicon nitride relative to silicon oxide is often less than that utilized removing silicon dioxide relative to silicon nitride. Specifically, there is recognition that it may be advantageous to utilize chemistries that can remove silicon nitride relative to silicon dioxide under low bias, as opposed to removing silicon dioxide relative to silicon nitride under high bias.

A reason that a low bias etch of silicon nitride may be advantageous relative to a high bias etch of silicon dioxide during the removal of sacrificial materials from adjacent patterned materials is because the low bias etch may be less likely to facet-etch through corners of the patterned materials than a high bias etch. Another reason is that is that the silicon nitride etch may be "cleaner" than a silicon dioxide etch, in that silicon dioxide etches may utilize organic polymer formation (for instance, $CF_x$ passivation polymer) that can be avoided in silicon nitride etches. A cleaner etch can reduce cost and complexity of a process relative to a less clean etch. For instance, there may be less need for subsequent cleaning steps when cleaner etches are utilized.

It may be particularly advantageous to reverse the roles of silicon nitride and silicon dioxide in applications in which the patterned material ultimately becomes dielectric spacers between adjacent conductive components. In the prior art, such spacers are formed of silicon nitride, which has a dielectric constant of from about 6 to about 8 (depending on stoichiometry). In contrast, in some of the embodiments described herein, the spacers are formed of silicon dioxide, which has a dielectric constant of about 4. The utilization of the lower dielectric constant material can reduce capacitive coupling between adjacent conductive components relative to that which occurs when using the higher dielectric constant material. The capacitive coupling between electrical components spaced from one another by silicon nitride is becoming increasingly problematic when the prior art processes are scaled to increasing levels of integration. Utilization of silicon dioxide spacers instead of silicon nitride spacers may thus enable higher levels of integration to be achieved than can be achieved utilizing prior art methods.

Example embodiments are described with reference to FIGS. 1-11.

Referring initially to FIGS. 1 and 2, a semiconductor construction 10 is illustrated in cross-sectional side view (FIG. 1) and top view (FIG. 2). The construction includes a semiconductor base 12. Base 12 may comprise, consist essentially of, or consist of monocrystalline silicon, and may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Although base 12 is shown to be homogenous, the base may comprise numerous layers in some embodiments. For instance, base 12 may correspond to a semiconductor substrate containing one or more layers associated with integrated circuit fabrication. In such embodiments, such layers may correspond to one or more of refractory metal layers, barrier layers, diffusion layers, insulator layers, etc.

Transistor devices 14 and 16 are supported by base 12. The transistor devices comprise transistor gates 18 and 20, respectively. Each of the transistor gates comprises gate dielectric 22, electrically conductive gate material 24, and dielectric capping material 26. The transistor gates 18 and 20 may be referred to as first and second transistor gates in some embodiments.

The gate dielectric 22 may comprise any suitable composition or combination of compositions; and in some embodiments may comprise, consist essentially of, or consist of silicon dioxide. The gate dielectric is shown to be a single homogeneous material, but in other embodiments may comprise two or more layers.

The electrically conductive gate material 24 may comprise any suitable composition or combination of compositions, and in some embodiments may comprise, consist essentially of, or consist of one or more of various metals (for instance, tungsten, titanium, platinum, etc.), metal-containing compositions (for instance, metal silicide, metal nitride, etc.) and conductively-doped semiconductor materials (for instance, conductively-doped silicon, conductively-doped germanium, etc.). The electrically conductive material 24 is shown to be a single homogeneous material, but in other embodiments may comprise two or more layers.

The dielectric capping material 26 may comprise any suitable electrically insulative composition or combination of compositions. The capping material 26 has an outer surface 27, and such outer surface will comprise, consist essentially of, or consist of silicon dioxide in some embodiments. The capping material 26 is shown to be a single homogeneous composition, but in other embodiments may comprise two or more layers.

A gap 28 is between transistor gates 18 and 20. In some embodiments, the conductive material 24 within transistor gates 18 and 20 will be comprised by conductive lines that extend in and out of the page relative to the cross-sectional view of FIG. 1. For instance, the conductive material 24 of transistor gate 18 may be comprised by a first wordline that extends in and out of the page relative to the cross-section of FIG. 1, and the conductive material 24 of transistor gate 20 may be comprised by a second wordline that extends in and out of the page relative to the cross-section of FIG. 1. The two wordlines may be considered to be adjacent conductive lines that are spaced from one another by gap 28; and the gap may be a trench that extends in and out of the page relative to the cross-section of FIG. 1.

Gap 28 is one of three gaps shown in the cross-section of FIG. 1. Specifically, another gap 40 is on an opposing side of transistor gate 18 from gap 28, and yet another gap 42 is on an opposing side of transistor gate 20 from gap 28. The gaps 28, 40 and 42 may be referred to as first, second and third gaps in some embodiments.

Dielectric spacers 30, 32, 34 and 36 are along sidewalls of transistor gates 18 and 20. The spacers 30 and 32 are along opposing sidewalls of transistor gate 18 relative to one another, and the spacers 34 and 36 are along opposing sidewalls of transistor gate 20 relative to one another. The spacers 32 and 34 are within gap 28, and narrow the gap.

Spacers 30, 32, 34 and 36 comprise material 31. Such material may be any suitable electrically insulative composition or combination of compositions. Material 31 is shown to be a single homogeneous composition, but in other embodiments may comprise two or more layers. The spacers have outer surfaces 33, and in some embodiments such outer surfaces comprise, consist essentially of, or consist of silicon dioxide.

A plurality of source/drain regions 50, 51 and 52 extend into substrate 12. The source/drain region 50 is beneath gap 28 and shared between transistor devices 14 and 16. Such source/drain region may be referred to as a first source/drain region in some embodiments. Source/drain region 51 is on an opposing side of transistor gate 18 from source/drain region 50, and may be referred to as a second source/drain region in some embodiments; and source/drain region 52 is on an opposing side of transistor gate 20 from source/drain region 50, and may be referred to as a third source/drain region in some embodiments. The source/drain regions 50 and 51 are gatedly connected to one another through transistor gate 18, and the source/drain regions 50 and 52 are gatedly connected to one another through transistor gate 20.

The source/drain regions 50-52 are electrically conductive implant regions formed within substrate 12. In some embodiments, the upper surface of the source/drain implant regions may correspond to monocrystalline silicon material of substrate 12. In other embodiments, one or more electrically conductive materials (for instance, titanium silicide) may be formed over substrate 12 on top of the source/drain implant regions at the processing stage of FIG. 1.

Isolation regions 44 and 46 are shown extending into substrate 12 to electrically isolate transistor devices 14 and 16 from adjacent circuitry (not shown). The isolation regions may, for example, correspond to shallow trench isolation regions. The isolation regions may be filled with any suitable dielectric material or combination of dielectric materials, and may, for example, be filled with one or both of silicon dioxide and silicon nitride. Although the isolation regions are shown filled with a single homogeneous material, in other embodiments the isolation regions may be filled with two more different materials.

The transistor gate 18, together with the spacers 30 and 32 adjacent thereto may be considered to be a first feature 60, and the transistor gate 20 together with the spacers 34 and 36 adjacent thereto may be considered to be a second feature 62 which is adjacent to the first feature. The features 60 and 62 have outer surfaces corresponding to the outer surfaces 33 of the spacers, and the outer surfaces 27 of the dielectric capping layers 26. Such outer surfaces may comprise, consist essentially of, or consist of silicon dioxide. In some embodiments, the outer surfaces may be considered to be silicon dioxide-containing surfaces that form shells around the conductive lines (material 24) of features 60 and 62. In the shown embodiment, the adjacent features 60 and 62 are of a common configuration relative to one another (specifically, both are dielectrically-encapsulated wordlines). In other embodiments, the adjacent features may be different configurations relative to one another.

Silicon nitride-containing material 66 is shown within gaps 28, 40 and 42. The silicon nitride-containing material may comprise, consist essentially of, or consist of silicon nitride. The material may be formed within gaps 28, 40 and 42 by depositing such material utilizing one or both of atomic layer deposition (ALD) and chemical vapor deposition (CVD). In some embodiments, the silicon nitride-containing material 66 may be deposited over and between transistor gates 18 and 20, and then chemical-mechanical polishing (CMP) or other suitable planarization may be utilized to form the shown planar surface 67 that extends across material 66 and across capping dielectric 26.

In the shown embodiment, silicon nitride-containing material 66 entirely fills all of gaps 28, 40 and 42. In other embodiments, the silicon nitride-containing material may be provided to an amount that less than entirely fills one or more of the gaps.

The top view of FIG. 2 shows that transistor gates 18 and 20 may be comprised by lines 70 and 72 and extend linearly along a first direction 71; and shows the silicon nitride-containing material 66 filling the gaps 28, 40 and 42 adjacent such lines. The silicon nitride within gaps 28, 40 and 42 is shown to form lines that extend parallel to lines 70 and 72.

Referring to FIGS. 3 and 4, a processing stage subsequent to that of FIGS. 1 and 2 is illustrated. The top view of FIG. 3 shows that masking material 74 may be formed across construction 10 to protect some regions of silicon nitride-containing material 66 (specifically, the regions under the masking material) while leaving other regions of silicon nitride material 66 unprotected.

Masking material 74 is patterned into a plurality of spaced apart linear strips 76 that extend along a direction 73 which crosses the first direction 71. In some embodiments, the direction 73 may be substantially orthogonal to the direction 71, with the term "substantially orthogonal" meaning that the direction 73 is orthogonal to within reasonable limitations of fabrication and measurement.

Patterned masking material 74 may comprise any suitable composition, and in some embodiments may be photolithographically-patterned photoresist.

The regions of the silicon nitride-containing material 66 that are protected by masking material 74 (specifically, the regions which are covered by masking material 74) may be referred to as first regions, while the unprotected (or exposed) regions of the silicon nitride-containing material may be referred to as second regions. The second regions of the silicon nitride-containing material are visible in the top view of FIG. 4, while the first regions are hidden beneath strips 76 of masking material 74. The masking material 74 is not shown in the cross-section of FIG. 3, even though the masking material would be visible in the background. This is because the cross-section of FIG. 3 (and all other cross-sections illustrated herein) only shows material that is along the plane of the cross-section, rather than also showing material that may be present behind the plane of the cross-section.

Referring to FIGS. 5 and 6, the exposed second regions of silicon nitride-containing material 66 are removed with an appropriate etch. The protected first regions of the silicon nitride-containing material remain over substrate 12, and are hidden beneath masking material 74 in the top view of FIG. 6.

The removal of the exposed second regions of the silicon nitride-containing material forms openings extending into gaps 28, 40 and 42, and in the shown embodiment entirely removes the silicon nitride-containing material from the gaps. In some embodiments, the openings formed within gaps 28, 40 and 42 extend entirely to an upper surface of base 12 (as shown). In other embodiments, one or more layers may be over such upper surface (for instance, layers of titanium silicide may be over source/drain regions 50-52) so that the openings formed within the gaps extend to such layers rather than to the upper surface of base 12.

In some embodiments, the etching utilized to remove silicon nitride-containing material 66 from within gaps 28, 40 and 42 will comprise subjecting such silicon nitride-containing material to an etching composition that includes $NF_3$ and HBr. Such etching composition may further include one or both of $N_2$ and $O_2$. Additionally, or alternatively, the etching composition may also include one or both of NO and $NO_2$. In particular embodiments, the etching composition may include $NF_3$, HBr, $N_2$, $O_2$ and one or both of NO and $NO_2$; and may be utilized with bias of less than or equal about 200 volts, a bias of less than or equal to about 100 volts, a bias of less than or equal to 50 volts, and in some embodiments a bias of less than or equal to about 10 volts. Such etching conditions may have selectivity for silicon nitride relative to silicon dioxide of at least about 50:1.

Figure 8:
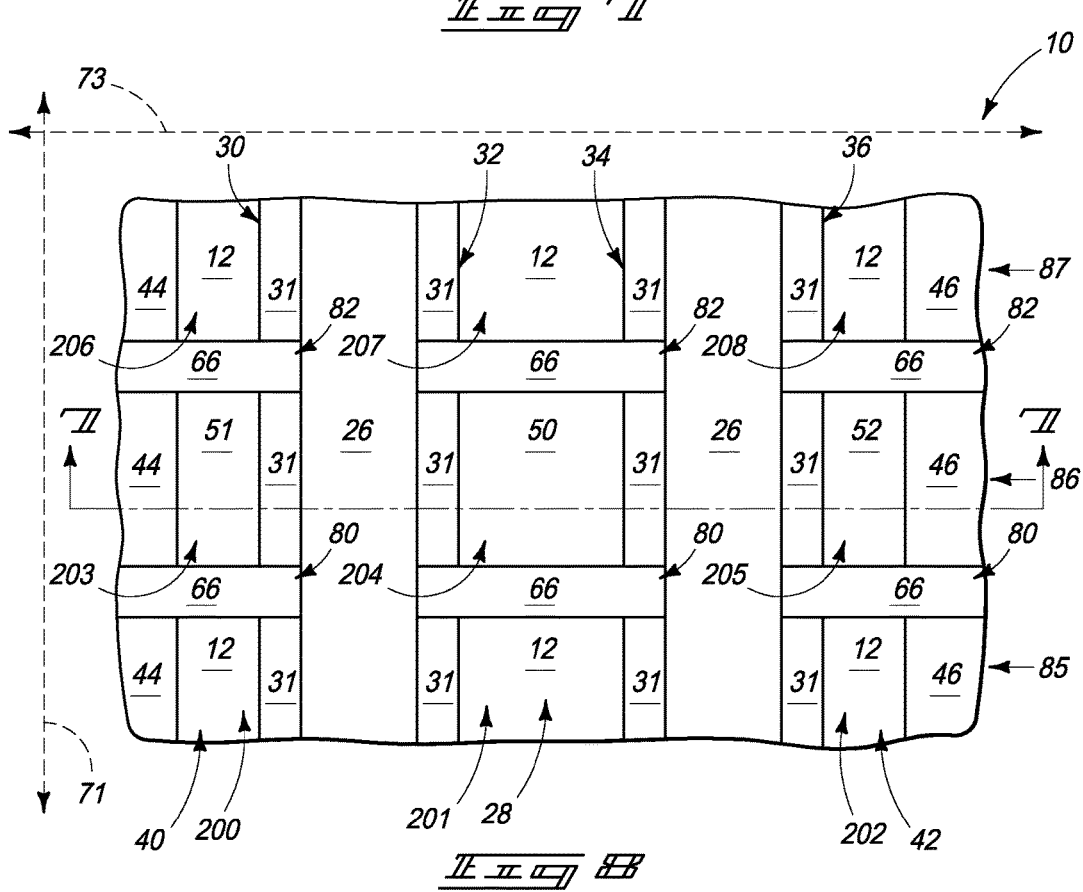

Referring to FIGS. 7 and 8, masking material 74 (FIG. 6) is removed. The removal of the masking material leaves the silicon nitride-containing material 66 that had been protected by such masking material (the so-called first regions of the silicon nitride-containing material) visible in the top view of FIG. 8. Such silicon nitride-containing material forms a pair of silicon nitride-containing barriers (which may be referred to herein as walls) 80 and 82. In the shown embodiment, the barriers 80 and 82 are discontinuous due to the silicon nitride-containing material 66 having been removed from over dielectric capping material 26 (FIG. 1). In other embodiments, the silicon nitride-containing material 66 may extend over capping material 26 at the processing stages of FIGS. 1-8, and accordingly the silicon nitride-containing barriers 80 and 82 may be continuous.

The top view of FIG. 8 shows that the openings 200-208 are within gaps 28, 40 and 42; and that such openings have a lateral peripheries that comprise silicon dioxide material 31 of the spacers 30, 32, 34 and 36; and that comprise silicon nitride from the silicon nitride-containing barriers 80 and 82 adjacent such openings. The top view of FIG. 8 also shows that openings 203, 204 and 205 together form a three-opening set 86 that extends along the direction 73, and that there are other similar three-opening sets 85 (comprising openings 200-202) and 87 (comprising openings 206-208) on opposing sides of the nitride-containing barriers 80 and 82 from the set 86. The three-opening sets 85-87 may be considered to be a series of three-opening sets. Each three-opening set may have source/drain regions at the bottom of the openings, analogous to the source/drain regions 50-52 of FIG. 7. The source/drain regions within the three-opening set 85 may be electrically isolated from those within the set 86 by isolation regions provided beneath silicon nitride-containing barrier 82; and similarly the source/drain regions within the set 87 may be electrically isolated from those within the set 86 by isolation regions provided beneath silicon nitride-containing barrier 80.

Referring to FIGS. 9 and 10, electrically conductive material 90 is deposited within openings 200-208 to form electrically conductive plugs within such openings. Only some of the plugs are labeled, and specifically the plugs within openings 203, 204 and 205 are labeled as plugs 91, 92 and 93, respectively. The plugs 91, 92 and 93 may be referred to as first, second and third plugs.

The plugs 91-93 are formed within the three-opening set 86. The top view of FIG. 10 shows that plugs of material 90 are also formed within the other three-opening sets 85 and 87. In some embodiments, the plugs of material 90 may be considered to be configured in multiple three-plug sets, with each three-plug set corresponding to the plugs formed within a three-opening set. The three-plug sets may form series analogous to the series of three-opening sets. Each three-plug set is spaced from an adjacent three-plug set, along the direction 71, by an intervening region of silicon nitride-containing material corresponding to one of the barriers 80 and 82. As discussed above with reference to FIG. 1, the gap 28 may be considered to be a trench formed between a pair of linear features 60 and 62. In such embodiments, the materials 66 and 90 may be considered to alternate with one another along the trench, and specifically along the direction 71 parallel to features 60 and 62.

The conductive material 90 may comprise any suitable composition or combination of compositions; and in some embodiments may comprise one or more of various metals, metal-containing compositions, and conductively-doped semiconductor materials. Although the plugs are shown to be homogeneous, in other embodiments the plugs may comprise multiple different layers. The material 90 may be deposited by any suitable methodology, including, for example, one or more of ALD, CVD and physical vapor deposition (PVD).

In subsequent processing, plug 91 may be electrically connected to a bit line 94; and plugs 92 and 93 may be electrically connected to first and second charge-storage devices (for instance capacitors) 96 and 98. The capacitors and bit line may be over the plugs 91-93 in some embodiments. The shown capacitors and bit line are connected with the plugs in openings 203-205. Capacitors and bit lines may be analogously connected to other conductive plugs within the openings 200-202 and 206-208.

The capacitor 96 may be comprised by a first dynamic random access (DRAM) unit cell, and the capacitor 98 may be comprised by a second DRAM unit cell; with such first and second DRAM unit cells being paired to share the bit line 94. Construction 10 may thus be utilized to form a plurality of DRAM unit cells of a DRAM array. In other embodiments, processing analogous to that of FIGS. 1-10 may be utilized to form other circuitry in addition to, or alternatively to, DRAM devices. Such other circuitry may include, for example, other memory devices and/or logic devices.

The electrically conductive plugs of material 90 have lateral surfaces 95 that directly contact silicon dioxide-containing surfaces 31, as shown in FIG. 9. The plugs also have lateral surfaces 95 that directly contact the silicon nitride-containing material 66, as shown in FIG. 10. The lateral surfaces of an individual plug define a lateral periphery of the plug, and thus the individual plugs have lateral peripheries that directly contact both silicon dioxide and silicon nitride. The lateral peripheries may have any suitable shapes, including for example, polygonal shapes, rectangular shapes, and square shapes.

In some embodiments it may be desired to replace silicon nitride-containing material 66 of FIG. 10 with another dielectric material having a different dielectric constant than silicon nitride. For instance, it may be desired to replace the silicon nitride-containing material with a dielectric material having a lower dielectric constant than silicon nitride to reduce capacitive coupling between electrically conductive materials spaced from one another by the intervening regions of material 66. FIG. 11 shows construction 10 at a processing stage subsequent to that of FIG. 10, and specifically after silicon nitride-containing material 66 (FIG. 10) has been removed to leave air gaps 100. Any suitable etch may be utilized to remove the silicon nitride-containing material 66.

In some embodiments, air may have a desired dielectric constant, and thus the air gaps may be left as is. In other embodiments, it may be desired to at least partially fill gaps 100 with another dielectric material, such as, for example, silicon dioxide. If it is desired to at least partially fill gaps 100 with silicon dioxide, the silicon dioxide may be deposited with any suitable method, such as, for example, one or both of ALD and CVD.

The embodiments discussed above may be utilized in fabricating integrated circuitry suitable for incorporation into any of numerous electronic systems, such as, for example, computers, cars, airplanes, clocks, cellular phones, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:
1. A semiconductor construction, comprising:
   a pair of adjacent features over a semiconductor substrate; the adjacent features being spaced from one another by a gap; the features having outer surfaces along the gap; all of the outer surfaces of the features along the gap comprising silicon dioxide; the features being first and second lines extending lengthwise along a first direction; the gap being a trench extending lengthwise along the first direction; and alternating electrically conductive plugs and intervening materials within the trench; the electrically conductive plugs and intervening materials alternating with one another along the first direction; the intervening materials consisting of silicon nitride; the electrically conductive plugs having lateral peripheries that directly contact silicon dioxide of the outer surfaces of the features, and that directly contact silicon nitride of the intervening regions.

2. The construction of claim 1 wherein the electrically conductive plugs electrically connect source/drain regions within the substrate under the plugs to circuitry above the plugs.

3. The construction of claim 1 wherein the electrically conductive plugs electrically connect source/drain regions within the substrate under the plugs to bitlines and capacitors.

4. The construction of claim 1 wherein the electrically conductive plugs comprise metal.

5. The construction of claim 1 wherein the lateral peripheries of the plugs are polygon-shaped.

6. The construction of claim 1 wherein the lateral peripheries of the plugs are rectangular-shaped.

7. The construction of claim 1 wherein the lateral peripheries of the plugs are square-shaped.

8. A semiconductor construction, comprising:
a pair of spaced-apart lines over a semiconductor substrate; outer surfaces of the lines comprising oxide; the lines extending lengthwise along a first direction; and
alternating electrically conductive plugs and silicon nitride structures within a region between the lines; the electrically conductive plugs and silicon nitride structures alternating with one another along the first direction; the electrically conductive plugs having lateral peripheries that directly contact oxide of the outer surfaces of the lines, and that directly contact silicon nitride of the silicon nitride structures.

9. The semiconductor construction of claim 8 wherein the silicon nitride structures consist of silicon nitrides and wherein the outer surfaces of the lines consist of silicon oxide.

10. The semiconductor construction of claim 8 wherein each of the spaced-apart lines comprises a dielectric shell around an electrically conductive structure.

11. The semiconductor construction of claim 8 wherein the pair of spaced-apart lines are substantially identical to one another in configuration.

12. The semiconductor construction of claim 8 wherein the pair of spaced apart lines are word lines.

13. A semiconductor construction, comprising:
a first line and a second line over a semiconductor substrate; outer sidewall surfaces of the first and second lines comprising oxide; the first and second lines each having a line width defined between the sidewall surfaces and having a length extending lengthwise along a first direction that is orthogonal relative to the line width;
a trench between the first line and the second line, the trench extending along the first direction; and
alternating electrically conductive plugs and silicon nitride structures within the trench; the electrically conductive plugs and silicon nitride structures alternating with one another along the first direction; the electrically conductive plugs and silicon nitride structures having lateral peripheries that directly contact oxide of the outer sidewall surfaces of the lines, the electrically conductive plugs directly contacting silicon nitride of the silicon nitride structures.

14. The semiconductor construction of claim 13 further comprising a first source/drain region extending into the substrate between the first and second lines.

15. The semiconductor construction of claim 14 further comprising a second source/drain region extending into the substrate on an opposing side of the first line relative to the first source/drain region and a third source/drain region extending into the substrate on an opposing side of the second line relative to the first source/drain region.

16. The semiconductor construction of claim 15 wherein the first source/drain region is associated with a first plug, wherein the second source/drain region is associated with a second plug and wherein the third source/drain region is associated with a third plug.

17. The semiconductor construction of claim 16 wherein the first plug is electrically connected to a bit line, wherein the second plug is electrically connected to a first charge-storage device, and wherein the third plug is electrically connected to a second charge-storage device.

18. The semiconductor construction of claim 13 wherein the first and second lines are word lines.

19. The semiconductor construction of claim 18 wherein the first and second source/drain regions are gatedly connected to one another through a first transistor gate comprised by a region of the first line, and wherein the first and third source/drain regions are gatedly connected to one another through a second transistor gate comprised by a region of the second line.

20. The semiconductive structure of claim 13 wherein the outer sidewall surfaces of the first and second lines consist of silicon oxide.

* * * * *